United States Patent
Goto

(10) Patent No.: US 10,459,349 B2
(45) Date of Patent: Oct. 29, 2019

(54) EXPOSURE METHOD, EXPOSURE APPARATUS AND METHOD OF MANUFACTURING ARTICLE

(71) Applicant: CANON KABUSHIKI KAISHA, Tokyo (JP)

(72) Inventor: Yoshio Goto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/003,824

(22) Filed: Jun. 8, 2018

(65) Prior Publication Data
US 2018/0364607 A1 Dec. 20, 2018

(30) Foreign Application Priority Data
Jun. 19, 2017 (JP) ................. 2017-119613

(51) Int. Cl.
*G03F 7/20* (2006.01)

(52) U.S. Cl.
CPC ...... *G03F 7/70725* (2013.01); *G03F 7/70625* (2013.01)

(58) Field of Classification Search
CPC .... G03F 7/70; G03F 7/70325; G03F 7/70625; G03F 7/70725; G03F 7/70775
USPC ........... 310/12.06; 355/53, 55, 72, 77
See application file for complete search history.

(56) References Cited

U.S. PATENT DOCUMENTS

| | | | |
|---|---|---|---|
| 7,239,375 B2 | 7/2007 | Tsuji | |
| 8,218,130 B2 | 7/2012 | Van Dam | |
| 8,760,618 B2 | 6/2014 | Sumiyoshi | |
| 2002/0003216 A1* | 1/2002 | Kida | G03F 7/70358 250/548 |
| 2009/0122290 A1* | 5/2009 | Van Dam | G03F 7/70358 355/67 |

FOREIGN PATENT DOCUMENTS

| | | |
|---|---|---|
| JP | 2004319780 A | 11/2004 |
| JP | 2005268489 A | 9/2005 |
| JP | 2009124139 A | 6/2009 |
| JP | 5312058 B2 | 10/2013 |

\* cited by examiner

*Primary Examiner* — Colin W Kreutzer
(74) *Attorney, Agent, or Firm* — Rossi, Kimms & McDowell LLP

(57) ABSTRACT

According to an aspect of the invention, an exposure method includes: moving a substrate during a period from a start to an end of exposure performed on any region among a plurality of exposure regions, wherein a timing at which the substrate is moved during the period is determined on the basis of a difference between a width of the pattern formed on the substrate in a first direction on a surface of the substrate and a width of the pattern formed on the substrate in a second direction on the surface of the substrate different from the first direction.

9 Claims, 7 Drawing Sheets

EXPOSURE METHOD, EXPOSURE APPARATUS AND METHOD OF MANUFACTURING ARTICLE

BACKGROUND OF THE INVENTION

Field of the Invention

The present invention relates to an exposure method, an exposure apparatus and a method of manufacturing an article.

Description of the Related Art

Reduction projection exposure apparatuses that project and transfer circuit patterns drawn on reticles on substrates using projection optical systems are used when fine semiconductor elements such as semiconductor memories or logic circuits are manufactured. In reduction projection exposure apparatuses, there is an increasing demand for improvement in the line width uniformity of patterns transferred to substrates along with reduction of circuit line widths in semiconductor elements.

Line width uniformity is also generally referred to as an HV difference and refers to a magnitude of a difference between a line width and a design line width of a pattern transferred to a substrate in a horizontal direction (H direction) and a vertical direction (V direction) of a substrate surface. When line width uniformity decreases, the yield of a semiconductor element decreases. As a method for improving line width uniformity, there is a method for distorting an effective light source distribution using a diaphragm, an ND filter, and the like (Japanese Patent Laid-Open No. 2005-268489).

However, in the method described in Japanese Patent Laid-Open No. 2005-268489, an adjustment mechanism for adjusting an effective light source is required, which may be disadvantageous, for example, in terms of manufacturing costs.

SUMMARY OF THE INVENTION

The present invention provides a technique for improving line width uniformity by a simple method.

According to an aspect of the invention, an exposure method of exposing exposure regions on a substrate by illuminating a pattern on an original, the method comprises: moving the substrate during a period from a start to an end of exposure performed on any region among the exposure regions. A timing at which the substrate is moved during the period is determined on the basis of a difference between a width of the pattern on the substrate in a first direction and a width of the pattern on the substrate in a second direction different from the first direction. The first and second directions are directions which are parallel with a surface of the substrate.

Further features of the present invention will become apparent from the following description of exemplary embodiments with reference to the attached drawings.

DESCRIPTION OF THE EMBODIMENTS

Figure 1:
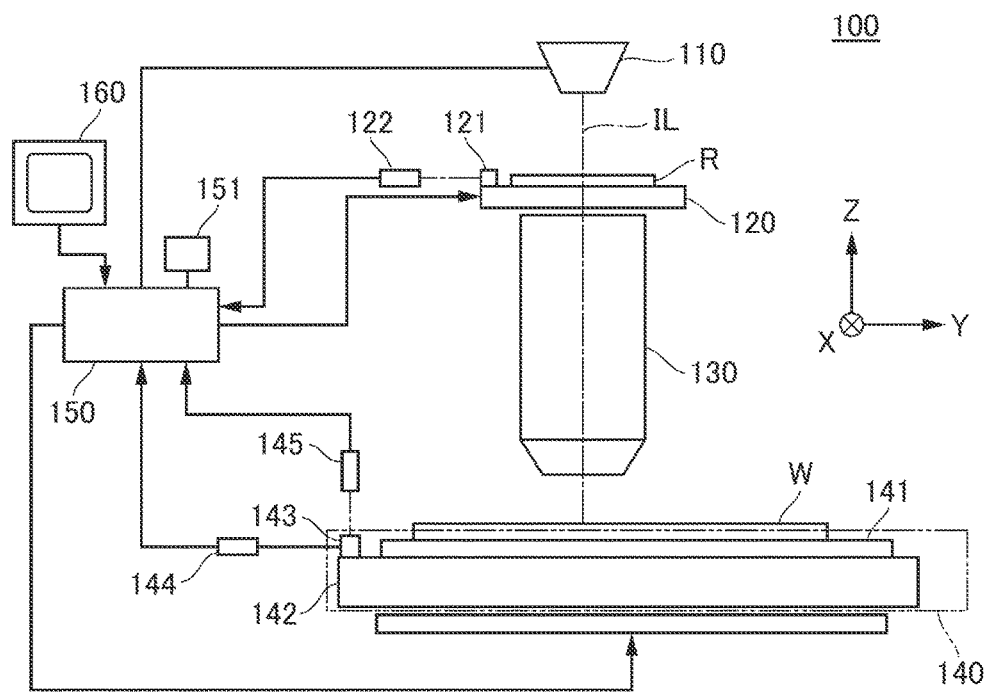
FIG. 1 is a schematic diagram showing a configuration of an exposure apparatus according to a first embodiment.

Embodiments of the present invention will be described below with reference to the drawings. Note that, in the drawings, the same members or constituent elements will be denoted with the same reference numerals and duplicated description thereof will be omitted.

First Embodiment

FIG. 1 is a schematic diagram showing a configuration of an exposure apparatus according to the embodiment. An exposure apparatus 100 in the embodiment is an apparatus configured to perform an exposure process on a wafer that is a substrate to be processed, which is used in a semiconductor device manufacturing process, and particularly, is a projection exposure apparatus in which a step and repeat method is adopted.

The exposure apparatus 100 includes a illumination optical system 110, a reticle stage 120 configured to hold a reticle R, a projection optical system 130, a wafer stage 140 configured to hold a substrate W, and a controller 150 configured to control constituent elements of the exposure apparatus 100. Note that in the following drawings description will be provided with a Z axis being set parallel with an optical axis of the projection optical system 130, an X axis being set to a direction which is perpendicular to a paper plane in a plane perpendicular to the Z axis, and a Y axis being set to a direction which is parallel with the paper plane orthogonal to the X axis.

The illumination optical system 110 is an apparatus including a light source unit (not shown) and configured to illuminate a reticle R on which a circuit pattern for transfer is formed. Examples of a light source included in the light source unit include a laser. Lasers which can be used are an ArF excimer laser with a wavelength of about 193 nm, a KrF excimer laser with a wavelength of about 248 nm, an F2 excimer laser with a wavelength of 157 nm, and the like.

Note that a type of laser is not limited to an excimer laser, and for example, a YAG laser may be used and the number of lasers is not limited. Furthermore, when a laser is used for the light source unit, it is desirable to use a light flux shaping optical system configured to shape a parallel light flux from a laser light source into a desired beam shape or an incoherent optical system configured to convert a coherent laser into an incoherent laser. In addition, the light source which can be used for the light source unit is not limited to a laser and can be one or more lamps such as a mercury lamp or a xenon lamp.

Although not shown, the illumination optical system 110 includes lenses, a mirror, a light integrator, a diaphragm, and the like. Generally, an internal optical system includes a condenser lens, a fly's eye, an aperture diaphragm, a condenser lens, a slit, and an imaging optical system which are arranged in this order. In this case, the light integrator includes an integrator or the like formed by overlapping a fly's eye lens or two sets of cylindrical lens array plates.

The light integrator may be replaced by an optical rod or a diffractive element in some cases. Furthermore, the light integrator may include an effective light source forming unit and be constituted so that the diaphragm and a prism can create and select a circle, annular illuminating for deformation illuminating, quadrupole illuminating, or the like. In addition, a configuration in which a polarization state of light can be controlled may be provided. A mechanism capable of adjusting a line width in a specific direction by asymmetrically distorting the effective light source distribution with the diaphragm or an ND filter or asymmetrically adjusting a polarization state of an effective light source through polarization adjustment may be provided.

The reticle R is, for example, an original made of quartz glass and has a circuit pattern to be transferred formed therein. Furthermore, the reticle stage 120 is an apparatus configured to hold and position the reticle R. The reticle stage 120 includes a moving mirror 121 and a laser interferometer 122 configured to project a laser beam onto the moving mirror 121, receive the reflected light, and thus detect a position of the reticle stage 120.

The projection optical system 130 forms an image of diffracted light of a pattern on the reticle R lit by exposure light IL from the illumination optical system 110 on the substrate W at a predetermined magnification (for example, ½, ¼, or ⅕) which interferes. An interference image formed on a substrate forms substantially the same image as a reticle pattern. The interference image is generally referred to as an optical image and determines a line width with which a shape of an optical image is formed on the substrate.

As the projection optical system 130, an optical system constituted of only a plurality of optical elements or an optical system (catadioptric optical system) constituted of a plurality of optical elements and at least one concave mirror can be adopted. Alternatively, as the projection optical system 130, an optical system constituted of a plurality of optical elements and a diffractive optical element such as at least one kinoform, an all mirror type optical system, or the like can also be adopted.

The substrate W is a substrate made of monocrystalline silicon, SiC, GaN, or $SiO_2$ whose surface is coated with a resist (photosensitive agent). The substrate W has a plurality of exposure regions (shots) on which patterns are formed. Furthermore, the wafer stage 140 is a substrate stage which can move in XYZ directions and is an apparatus configured to hold and position the substrate W. The wafer stage 140 includes a holding part 141 configured to suction and hold the substrate W and a support 142 configured to support the holding part 141.

Although not illustrated in the drawing, the wafer stage 140 includes an actuator using an air spring on an upper surface of the support 142 in a vertical direction. In addition, the wafer stage 140 includes a moving mirror 143 and a laser interferometer (position measuring means) 144 configured to project a laser beam to the moving mirror 143 and to detect an amount of driving from a position of the wafer stage 140 by receiving the reflected light. At a part above the wafer stage 140 (on the Z axis), there is a laser interferometer 145 configured to detect a position and vibration of the wafer stage 140 relative to the Z axis.

The controller 150 is a control unit configured to control constituent elements such as an optical system or a stage system such that an exposure process, driving of the reticle R or the substrate W at the time of the exposure process, or the like is performed. The controller 150 executes an exposure method of the present invention in the form of a sequence or a program and is constituted of a computer including a storage device 151 constituted of a magnetic storage device, a memory, or the like, a sequencer, or the like.

Also, the controller 150 includes a console 160 by which a user sets various operation commands. The controller 150 transmits a command associated with starting of an exposure process (output of exposure light IL), driving of the reticle stage 120 and the wafer stage 140, or the like via a cable of a local area network (LAN) or the like. The controller 150 collects measurement values of positions and vibration of the reticle stage 120 and the wafer stage 140 through each of the laser interferometers 122, 144, and 145. The collected information is stored in the storage device 151.

In the console 160, the user inputs recipe information in advance. The input recipe information is stored in the storage device 151 and an exposure process or stage movement is performed in accordance with a layout instruction.

Figure 2:
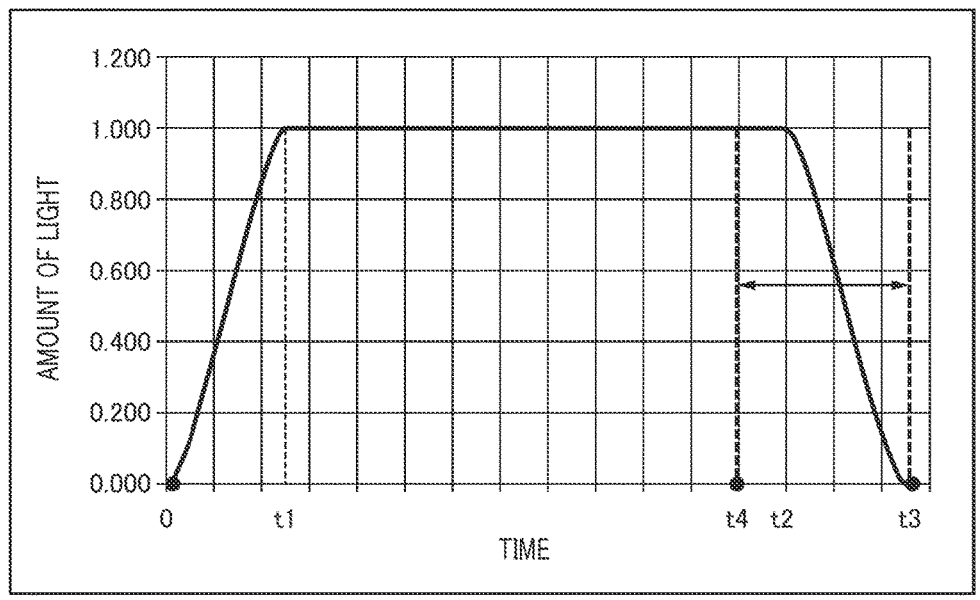
FIG. 2 is an example of a relationship between an amount of exposure light and a time from an exposure start to an exposure end.

Next, a basic operation of the embodiment will be described. FIG. 2 illustrates an example of a relationship between an amount of exposure light and time from an exposure start to an exposure end of one exposure region among a plurality of exposure regions on the substrate W. A horizontal axis indicates time and a vertical axis indicates an amount of exposure light. Exposure starts at 0 and a diaphragm (exposure shutter) starts to open during $t_1$. Exposure is normally performed from $t_1$ to $t_2$, the exposure shutter starts to close from $t_2$, and the exposure shutter has been closed by $t_3$. In the case of the step and repeat method, after $t_3$ at which the exposure shutter has closed, the wafer stage 140 starts moving stepwise toward the next exposure region. In the embodiment, in order to improve line width uniformity, driving of the wafer stage 140 starts in a period from an exposure start to an exposure end (during exposure), that is, before the exposure shutter has been closed.

Hereinafter, driving the stage before the exposure shutter has been closed is referred to as a "forward driving" and a timing at which forward driving starts is referred to as a "stage driving start timing." In FIG. 2, an exposure end time is $t_3$ and the wafer stage 140 is driven from $t_4$ during exposure. In this case, the "stage driving start timing" is $t_4$.

Figure 3:
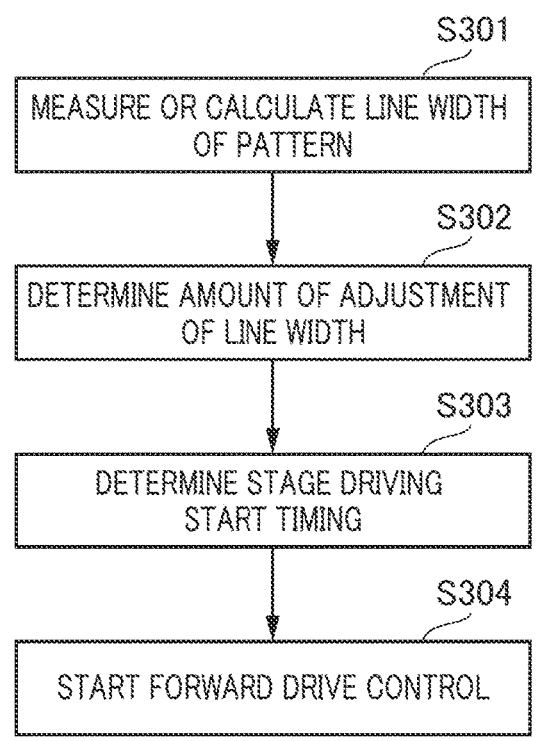
FIG. 3 is a flowchart for describing line width adjustment.

FIG. 3 is a flowchart for describing line width adjustment. In Step S301, a line width of a pattern formed on the substrate W is measured and is obtained through calculation (calculation of the line width). For example, a scanning electron microscope (SEM), an optical microscope, or the like can be used for measurement of the line width. For example, calculation of the line width is based on optical image calculation in which at least one of a design value of the projection optical system 130, aberration after the projection optical system 130 is manufactured, and an effective light source distribution is considered.

In Step S302, an amount of adjustment of the line width in a specific direction is determined from the obtained line width. For example, the amount of adjustment may be determined on the basis of a difference between a width in a surface of the substrate W in a first direction and a width in the surface of the substrate W in a second direction different from the first direction. In Step S303, the "stage driving start timing" of the wafer stage 140 is determined from an amount of adjustment and a stage speed or an acceleration in a specific direction and an amount of exposure. In Step S304, a forward drive timing determined in Step S303 is input through the console 160 and the controller 150 causes the wafer stage 140 to be "driven forward" using the input "stage driving start timing."

Figure 4:
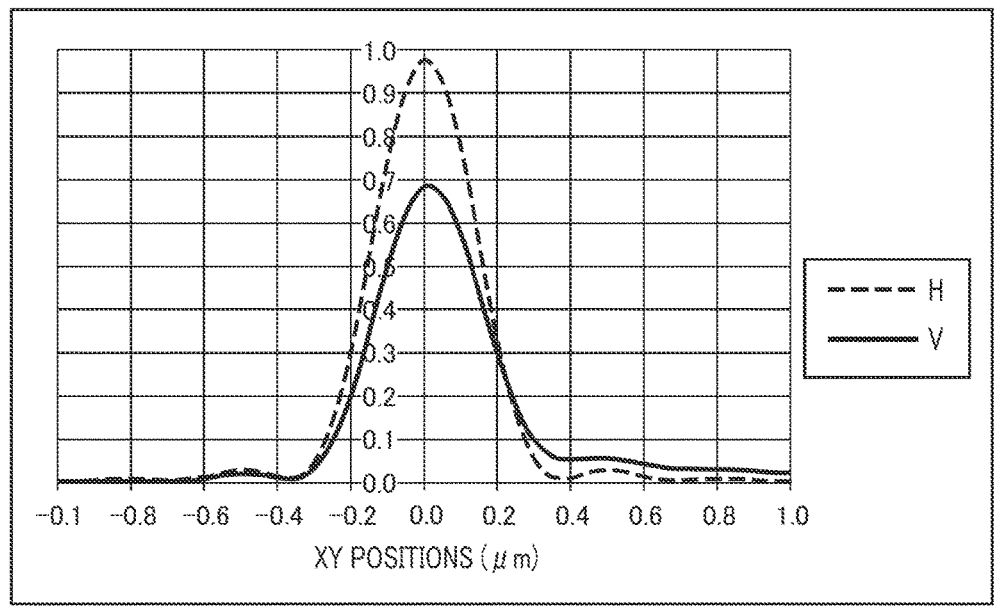
FIG. 4 is a simulation result of an optical image according to the first embodiment.

A principle of line width adjustment through forward driving will be described. First, it is assumed that a pattern in which a pattern to be exposed is parallel to an X direction is an H pattern and a pattern in which the pattern to be exposed is parallel to a Y direction is a V pattern. FIG. 4 illustrates a simulation result of an optical image when the wafer stage 140 starts X-step driving during exposure. While the H pattern (parallel to the step direction in the embodiment) is not affected at all on the optical image, exposure in the V pattern (perpendicular to the step direction in the embodiment) is performed while an image is moved in the step direction. Thus, the optical image changes and the line width changes.

As described above, a line width of a pattern perpendicular to a stage step driving direction can be adjusted through stage driving during exposure. For example, when the wafer stage 140 is in a Y step, the line width of the H pattern perpendicular to the step direction can be adjusted. Furthermore, a line width is thin in a remaining pattern of a resist and is thick in an omission pattern thereof. Since the line width in the specific direction can be adjusted in this way, it is possible to adjust a line width of a line and space exposure layout of only the V pattern or only the H pattern or to correct an HV difference when the H pattern and the V pattern are present together.

A specific example of HV difference correction when forward driving is actually performed in the flow illustrated in FIG. 3 will be described. First, from a result of evaluating the line width (remaining pattern) of the exposed substrate W, it can be seen that an HV difference (V−H) of about +ΔHV has occurred. In this case, an adjustment target is "the step direction is set to X and the V pattern is made thinner by −ΔHV." From a result of an optical simulation in which the stage acceleration and the amount of exposure is conserved, it can be seen that correction can be satisfactorily performed by performing stage forward driving at a stage driving start timing T. A stage driving start timing T is input to the console 160 and forward exposure is performed through the controller 150.

Figure 5:
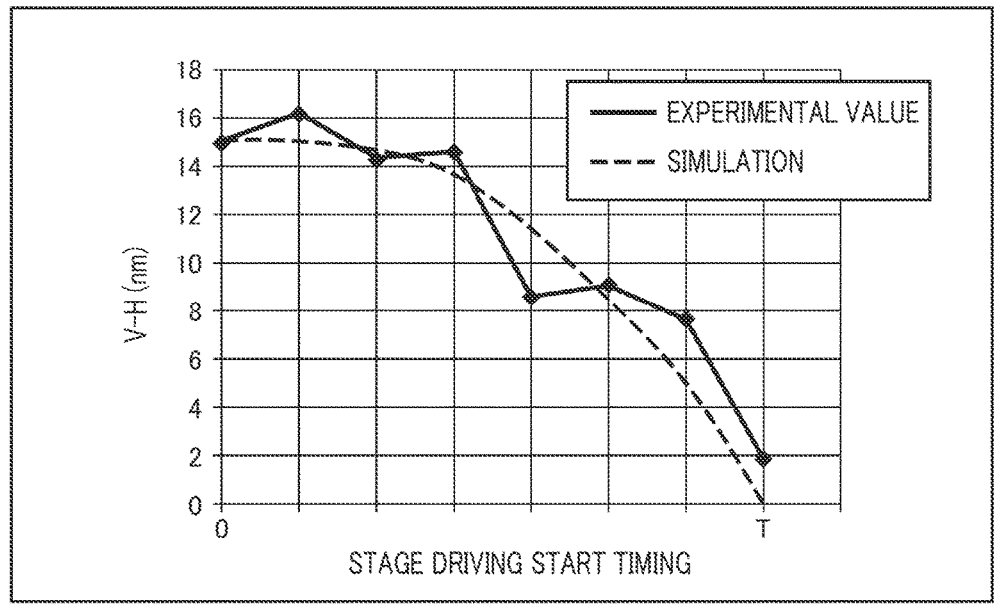
FIG. 5 is a diagram showing a correlation between a stage driving start timing and an HV difference.

FIG. 5 is a diagram showing a correlation between a stage driving start timing and an HV difference. When forward driving is not being performed, that is, at a stage driving start timing of 0 msec, an HV difference (V−H) of +ΔHV=about 15 nm occurs. When X step forward driving is performed, the V pattern becomes thinner and an HV difference is reduced and the HV difference is 2 nm as an experimental value and zero in a simulation at the stage driving start timimg T.

In the embodiment, the stage driving start timing is calculated from an amount of HV difference correction and a stage acceleration in the simulation. The storage device 151 stores the stage acceleration, speed data, and an amount of exposure and the controller 150 may automatically calculate the stage driving start timing from the corrected HV difference with reference to data held in the storage device 151 and perform forward driving.

It is possible to set a common stage driving start timing for each shot, that is, for each board, perform optimization for each shot, set a different stage driving start timing for each shot, and perform forward driving.

In the embodiment, an optical image may become asymmetrical due to forward driving performed in the step direction and thus an image shift may occur. Shift correction in which an exposure position is adjusted in consideration of the image shift can be performed if necessary. Furthermore, it is also possible to prevent the optical image from becoming asymmetrical by alternately driving the stage in the step direction, and a 180° direction to the step direction during exposure and to prevent occurrence of shifting.

Figure 6:
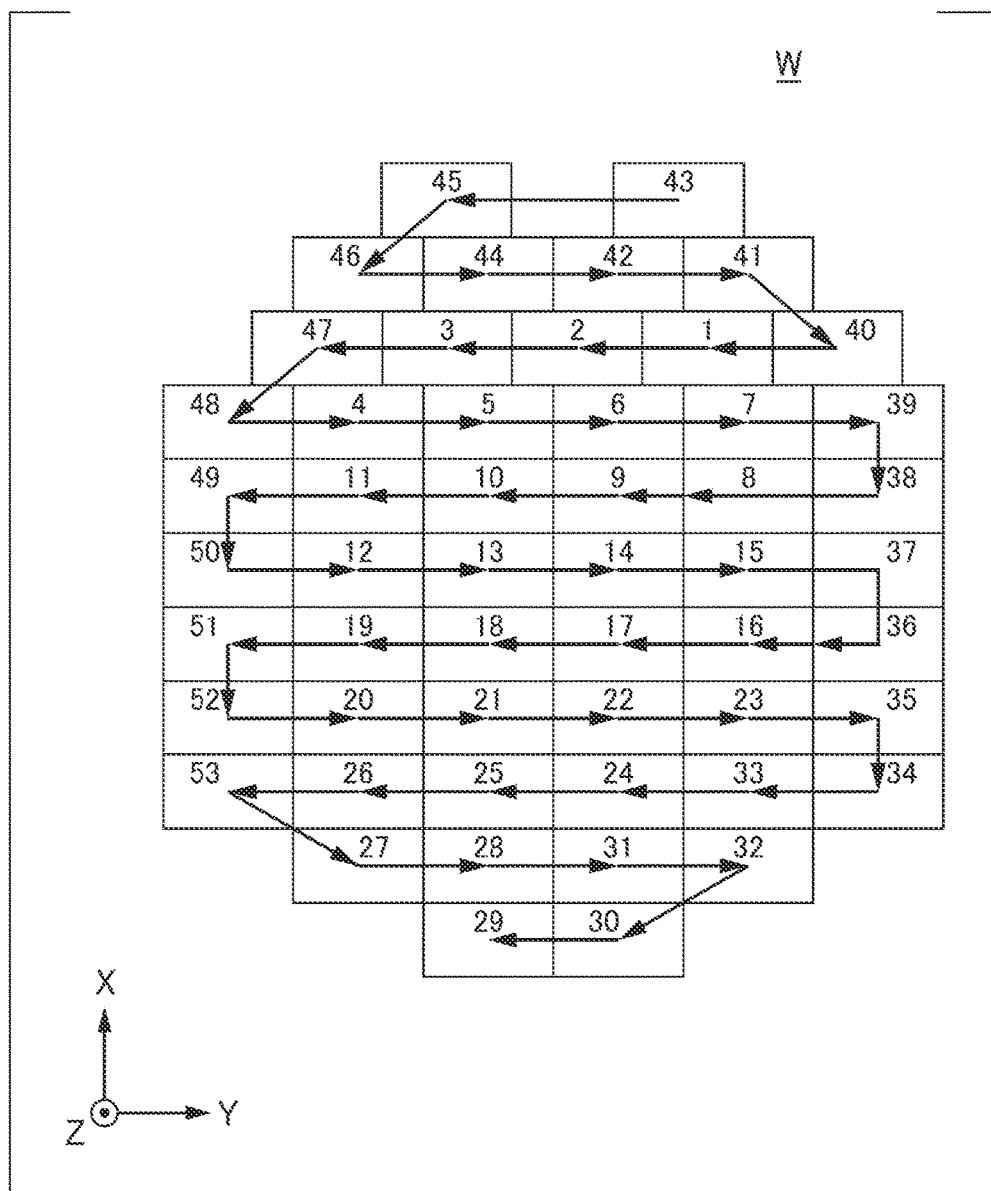
FIG. 6 is an example of step driving of a wafer stage.
Figure 7:
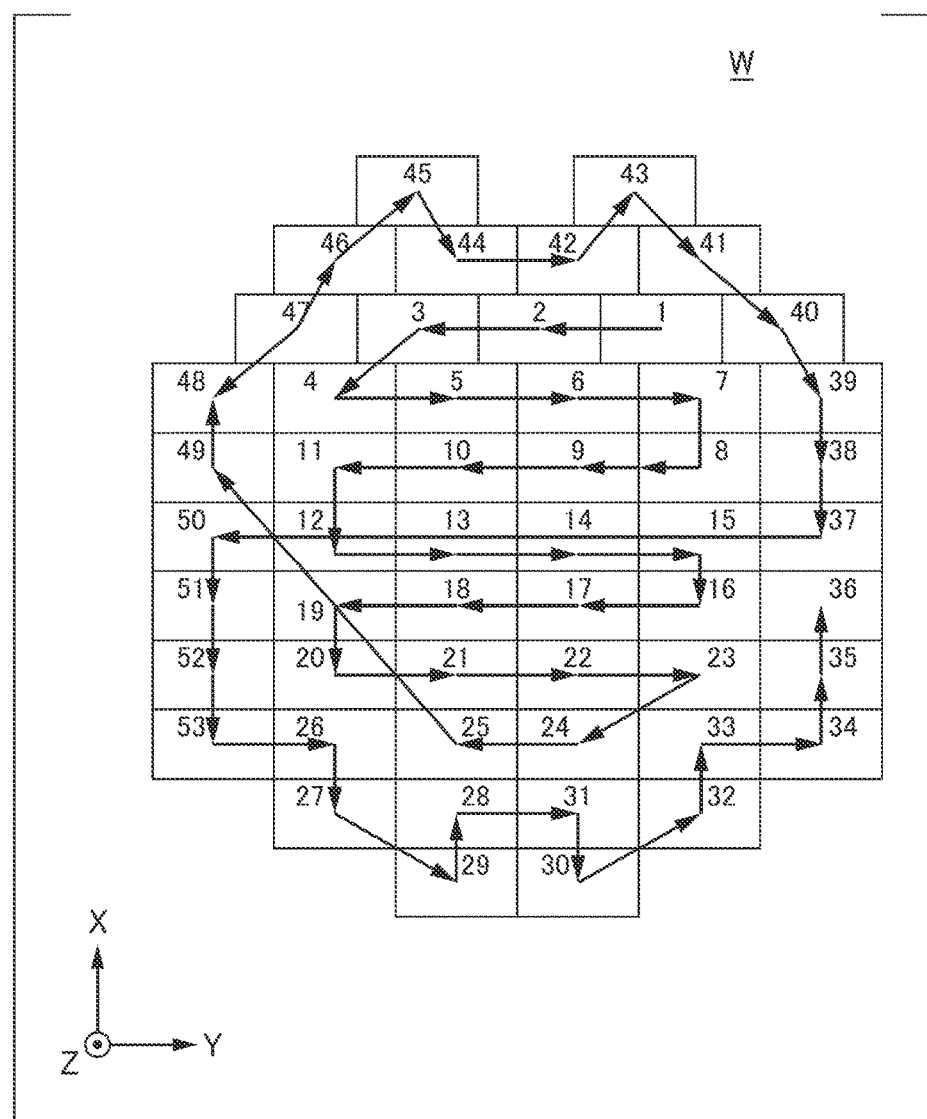
FIG. 7 is an example of step driving of a wafer stage in which an HV difference is minimized.

The step direction of the wafer stage 140 may be optimized depending on the HV difference for each shot. FIG. 6 is an example of step driving of the wafer stage 140. FIG. 7 is an example of step driving of the wafer stage 140 in which an HV difference is minimized. In the drawings, the reference numerals indicate locations of exposure regions and exposure is performed in the order of the arrows. Normally, as illustrated in FIG. 6, the wafer stage 140 is subjected to step driving in a snake shape, but as illustrated in FIG. 7, the step may be optimized to minimize an HV difference in the substrate.

In a case in which the wafer stage 140 is subjected to step driving obliquely from a $45^{th}$ shot to a $46^{th}$ shot in FIG. 6, the wafer stage 140 can be slightly stepped in the X direction during exposure and then be moved to a $46^{th}$ shot position after the exposure has ended when a necessary correction direction is the X direction.

Figure 8:
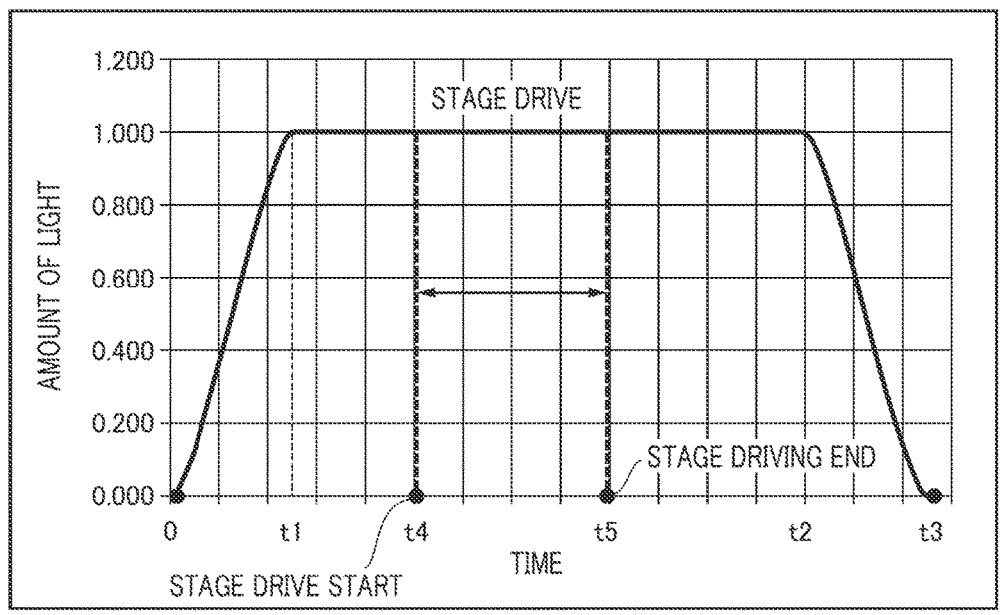
FIG. 8 is a relationship between an amount of exposure light and time.

Stage driving for correcting a line width may be ended before starting the step driving. FIG. 8 illustrates an example of a relationship between an amount of exposure light and time from an exposure start to an exposure end of one exposure region among a plurality of exposure regions on the substrate W. A horizontal axis represents time and a vertical axis represents an amount of exposure light. As illustrated in FIG. 8, the stage driving is started at $t_4$ during steady exposure from $t_1$ to $t_2$ and the stage driving is ended at $t_5$. Driving in a stage driving direction may be in one direction determined to be a line width correction direction and the stage may be alternately driven in one direction and 180° to this one direction. A stage driving time is determined from an amount of line width correction, a stage speed, an acceleration, and an amount of exposure.

As described above, according to the exposure method of the embodiment, line width uniformity can be improved by a simple method for adjusting a stage driving timing without using an adjustment mechanism such as adjusting an effective light source for adjusting the line width.

Second Embodiment

In the first embodiment, the wafer stage 140 is driven before the exposure shutter has been closed when exposure of one shot is performed so that the line width is adjusted. In the embodiment, the line width is adjusted by starting the exposure in a process of driving the wafer stage 140.

Figure 9:
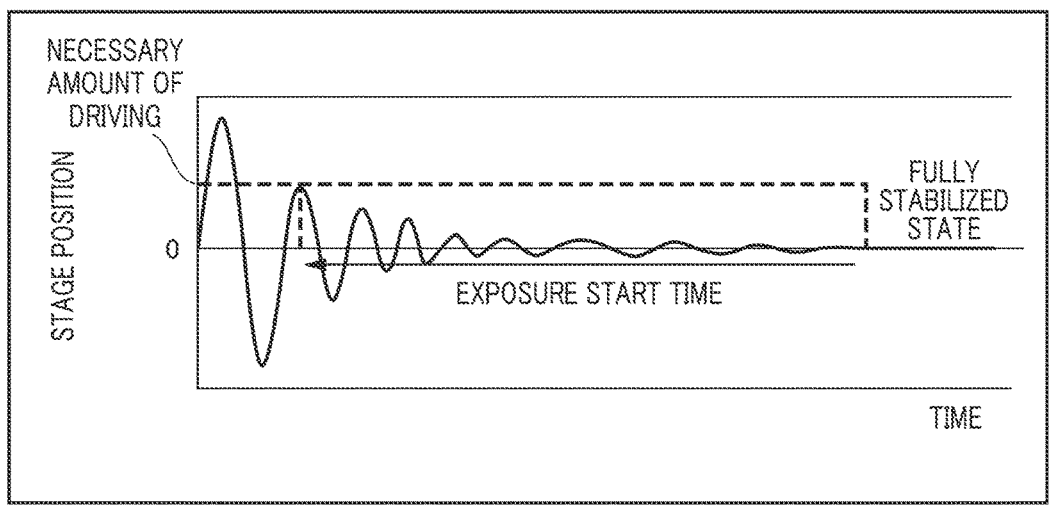
FIG. 9 is a graph showing a position of a wafer stage in a step direction.

FIG. 9 is a graph showing a position of the wafer stage 140 in a step direction measured by a laser interferometer 144 until the wafer stage 140 is subjected to step driving to an exposure position and then is completely stopped. A horizontal axis represents time and a vertical axis represents a position of the wafer stage in a step direction. The origin is a position (target position) of the wafer stage 140 when any one of the shots is exposed.

During a process of moving the wafer stage 140 to the target position, the wafer stage 140 vibrates about the target position. An amplitude of the vibration of the wafer stage 140 gradually decreases after the wafer stage 140 arrives near the target position. In a conventional exposure apparatus, for example, a fully stabilized time shown in FIG. 9 is set to a time at which the driving of the wafer stage 140 is finished and exposure of a shot is started after this point. A time at which an amplitude becomes small to a certain extent before a fully stabilized state may be set to a time at which the driving of the wafer stage 140 is finished. In the embodiment, the line width is adjusted by starting the exposure without waiting for a stabilized state of the wafer stage 140, that is, during driving, using the vibration of the wafer stage 140.

A start timing of exposure is a time at which an amount of vibration (amplitude) matches an amount of driving of the wafer stage 140 required for line width adjustment. An amount of adjustment and a necessary amount of driving can be obtained in the same way as in the first embodiment.

Figure 10:
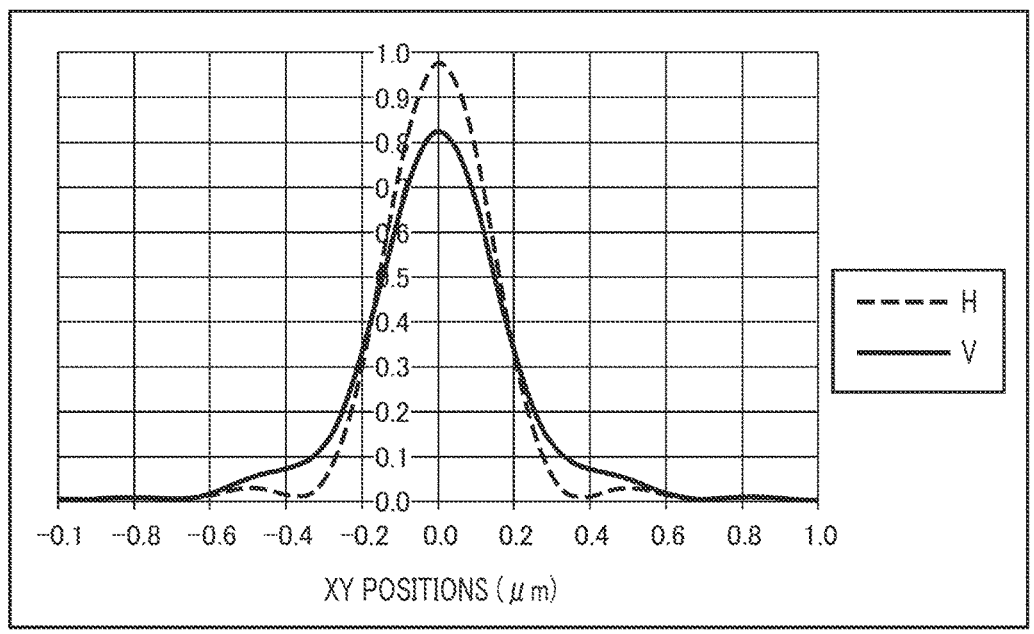
FIG. 10 is a simulation result of an optical image when exposure is started during driving of a wafer stage.

FIG. 10 is a simulation result of an optical image when exposure is started during driving of the wafer stage 140. A H pattern (parallel to a step direction in the embodiment) does not change when the wafer stage 140 starts exposure during X driving, but an optical image in a V pattern (perpendicular to the step direction in the embodiment) changes and thus a line width is changed. In this way, a line width of a pattern perpendicular to a stage step driving direction can be adjusted by stage driving during exposure. Furthermore, a line width is thin in a remaining pattern of a resist and is thick in an omission pattern.

Unlike the first embodiment, since the stage is driven in a +X direction and a −X direction, an image is distorted with left/right symmetry and an influence of an image shift is reduced. Since a line width in a specific direction can be adjusted in this way, it is possible to adjust a line width of a line and space exposure layout of only the V pattern or only the H pattern or to correct an HV difference when the H pattern and the V pattern are present together.

Figure 11:
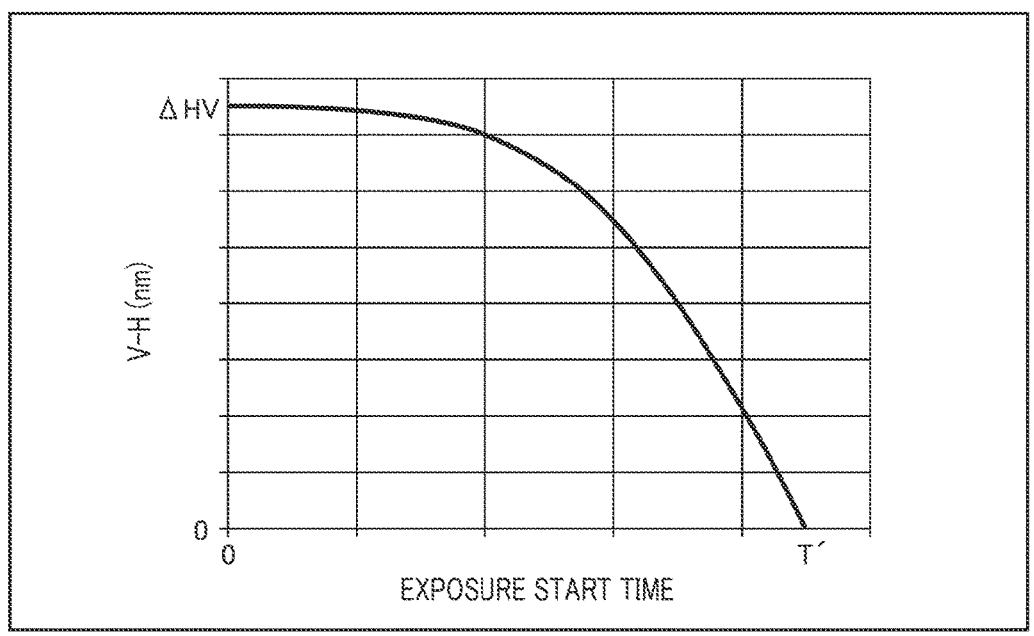
FIG. 11 is a diagram showing a correlation between an exposure start time and an HV difference.

FIG. 11 is a diagram showing a correlation between an exposure start time and an HV difference. A pattern is the remaining pattern in a shot in which the wafer stage 140 is X-stepped. In the embodiment, an exposure start time is set to T'. In the embodiment, "the exposure start time" is obtained from the amount of HV difference correction, but the apparatus ascertains an amount of driving of the wafer stage 140 measured by a laser interferometer 144 from an input corrected HV difference and the controller 150 may automatically calculate "the exposure start time" and perform exposure. As described above, the same effects as in the first embodiment can be obtained also in this embodiment.

Note that line width correction in a specific direction in which adjustment of an effective light source distribution used in the related art and the first embodiment or the second embodiment are used together may be performed. Furthermore, a line width correction direction in a specific direction may not coincide with an ideal step direction, for example, in terms of productivity of the wafer stage 140 and there may be cases in which a shot in which line width correction and productivity are not compatible is present. Line width correction in a specific direction may be performed on a shot in which a correction direction does not coincide with a step direction by adjusting an effective light source distribution. In addition to the adjustment of the effective light source distribution, for example, the longitudinal lateral magnification correction mechanism described in Japanese Patent No. 5312058 can be used together therewith.

(Example Associated with Method for Manufacturing Article)

A method for manufacturing an article according to the embodiment is appropriate for manufacturing, for example, articles such as a semiconductor or the like or elements having a fine structure or the like. Examples of the articles include electrical circuit elements, optical elements, microelectromechanical systems (MEMS), recording elements, sensors, molds, and the like. Examples of the electrical circuit elements include volatile or nonvolatile semiconductor memories such as a dynamic random access memory (DRAM), a static random access memory (SRAM), a flash memory, a magnetic random access memory (MRAM), semiconductor elements such as a large scale integration (LSI), a charge coupled device (CCD), an image sensor, a field programmable gate array (FPGA), and the like. Examples of the molds include molds for imprinting and the like. The method for manufacturing an article in the embodiment includes forming a latent pattern of a photosensitive agent with which a substrate is coated using the exposure apparatus (a step of exposing the substrate) and developing the substrate on which the latent pattern is formed in such a process. In addition, such a manufacturing method may include other known processes (oxidation, deposition, evaporation, doping, flattening, etching, resist stripping, dicing, bonding, packing, and the like). The substrate may be made of glass, ceramics, metals, semiconductors, resins, and the like and a member made of a material different from that of the substrate may be formed on a surface thereof if necessary. Specific examples of the substrate include silicon wafers, compound semiconductor wafers, quartz glass, and the like.

Other Embodiments

Although the embodiments of the present invention have been described above, the present invention is not limited to these embodiments, and various modifications are possible without departing from the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-119613 filed on Jun. 19, 2017, which are hereby incorporated by reference herein in its entirety.

What is claimed is:

1. An exposure method of exposing exposure regions on a substrate by illuminating a pattern on an original, the method comprising:
 moving the substrate during a period from a start to an end of exposure performed on any region among the exposure regions,
 wherein a timing at which the substrate is moved during the period is determined on the basis of a difference between a width of a pattern formed on the substrate in a first direction and a width of the pattern formed on the substrate in a second direction different from the first direction, and the first and second directions are directions which are parallel with a surface of the substrate.

2. The exposure method according to claim 1, wherein a direction in which the substrate is moved is determined on the basis of the difference.

3. The exposure method according to claim 1, wherein an amount of movement of the substrate is determined on the basis of the difference.

4. The exposure method according to claim 1, wherein a timing of the start of the exposure is determined on the basis of the difference.

5. The exposure method according to claim 4, wherein the timing of the start of the exposure is determined on the basis of an amount of vibration of the substrate generated in a process of moving the substrate to a position at which the exposure of the any region is performed.

6. The exposure method according to claim 1, further comprising:
adjusting an effective light source distribution of an optical system configured to illuminate the original on the basis of the difference.

7. The exposure method according to claim 1, wherein the difference of each of patterns on the exposure regions is calculated.

8. An exposure apparatus which exposes exposure regions on a substrate by illuminating a pattern on an original, the apparatus comprising:
a stage configured to hold and move the substrate; and
a controller configured to control the stage,
wherein the controller is configured to:
move the substrate during a period from a start to an end of exposure performed on any region among the exposure regions, and
determine a timing at which the substrate is moved during the period on the basis of a difference between a width of a pattern formed on the substrate in a first direction and a width of the pattern formed on the substrate in a second direction different from the first direction, where the first and second directions are directions which are parallel with a surface of the substrate.

9. A method of manufacturing an article comprising:
exposing a substrate using an exposure method; and
developing the substrate exposed in the exposing,
wherein the exposure method exposes exposure regions on a substrate by illuminating a pattern on an original, and comprises moving the substrate during a period from a start to an end of exposure performed on any region among the exposure regions,
a timing at which the substrate is moved during the period is determined on the basis of a difference between a width of a pattern formed on the substrate in a first direction and a width of the pattern formed on the substrate in a second direction different from the first direction, and
the first and second directions are directions which are parallel with a surface of the substrate.

* * * * *